US007786763B1

(12) United States Patent
Bal et al.

(10) Patent No.: US 7,786,763 B1
(45) Date of Patent: Aug. 31, 2010

(54) CLOCK CIRCUIT WITH HARMONIC FREQUENCY DETECTOR

(75) Inventors: Jagdeep Bal, Saratoga, CA (US); Tao Jing, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/346,764

(22) Filed: Dec. 30, 2008

(51) Int. Cl.
*H03D 13/00* (2006.01)
(52) U.S. Cl. .............................. 327/43; 327/40; 327/47; 327/49; 327/156
(58) Field of Classification Search ............. 327/39–43, 327/47–49, 147, 156
See application file for complete search history.

(56) References Cited

U.S. PATENT DOCUMENTS

| | | | |
|---|---|---|---|
| 4,080,576 A | 3/1978 | Huber et al. | |
| 5,337,022 A | 8/1994 | Pritchett | |
| 7,113,606 B2 | 9/2006 | Botti et al. | |
| 7,170,323 B1 | 1/2007 | Greenberg | |
| 7,298,066 B2 * | 11/2007 | Kawaguchi et al. | 310/316.01 |
| 7,512,202 B2 * | 3/2009 | Dalton et al. | 375/368 |

* cited by examiner

*Primary Examiner*—Lincoln Donovan
*Assistant Examiner*—Patrick O'Neill
(74) *Attorney, Agent, or Firm*—Stanley J. PAwlik; Kenneth Glass; Glass & Associates

(57) ABSTRACT

A clock circuit includes a phase-lock loop for generating an output clock signal based on a data signal and a harmonic frequency detector for detecting whether the frequency of the output clock signal is a harmonic frequency of a frequency of a reference clock signal. The harmonic frequency detector includes a counter for generating a first divided clock signal by dividing the frequency of the output clock signal by a first divisor. Additionally, the harmonic frequency detector includes a counter for generating a second divided clock signal by dividing the frequency of the reference clock signal by a second divisor. The harmonic frequency detector also includes a frequency comparator for generating an output indicating whether the frequency of the output clock signal is a harmonic frequency of the frequency of the reference clock signal based on the first divided clock signal and the second divided clock signal.

20 Claims, 7 Drawing Sheets

CLOCK CIRCUIT WITH HARMONIC FREQUENCY DETECTOR

BACKGROUND

In some types of communication systems, a transmitter encodes a sequence of data values into a serial data signal based on a transmit clock signal and transmits the serial data signal to a receiver in the communication system. The receiver reconstructs the transmit clock signal based on the serial data signal received from the transmitter and recovers the sequence of data values from the serial data signal based on the reconstructed clock signal.

Generally, the frequency of the reconstructed clock signal is based on the data rate of the serial data signal and is the same as the frequency of the transmit clock signal. In some cases, the receiver may reconstruct the transmit clock signal to have a harmonic frequency of the frequency of the transmit clock signal instead of the frequency of the transmit clock signal. As a result, the receiver does not accurately recover the sequence of data values from the serial data signal.

In light of the above, a need exists for an improved system and method of reconstructing a clock signal from a serial data signal. A further need exists for detecting a harmonic frequency in a clock signal reconstructed from a serial data signal.

SUMMARY

In various embodiments, a clock circuit includes a phase-lock loop for generating an output clock signal based on a data signal. Additionally, the clock circuit includes a harmonic frequency detector for detecting whether the frequency of the output clock signal is a harmonic frequency of a reference frequency. The harmonic frequency detector includes a counter for generating a first divided clock signal by dividing the frequency of the output clock signal by a first divisor. Additionally, the harmonic frequency detector includes a counter for generating a second divided clock signal by dividing the reference frequency by a second divisor. The harmonic frequency detector also includes a frequency comparator for generating an output indicating whether the frequency of the output clock signal is a harmonic frequency of the reference frequency based on the first divided clock signal and the second divided clock signal.

In further embodiments, the first divisor and the second divisor are programmable to select a threshold frequency between the reference frequency and the first harmonic frequency of the reference frequency. Moreover, the frequency comparator determines that the frequency of the output clock signal is a harmonic frequency of the reference frequency if the frequency of the output clock signal is above the threshold frequency. In this way, the threshold frequency defines a frequency tolerance for determining whether the frequency of the output clock signal is a harmonic frequency of the reference frequency and the harmonic frequency detector is programmable to select the frequency tolerance.

A system, in accordance with one embodiment, includes a first counter, a second counter, and a frequency comparator coupled to the first counter and the second counter. The first counter is configured to receive a first clock signal and generate a first divided clock signal by dividing the frequency of the first clock signal by a first divisor. The second counter is configured to receive a second clock signal and generate a second divided clock signal by dividing the frequency of the second clock signal by a second divisor. The frequency comparator is configured to generate an output indicating whether the frequency of the first clock signal is a harmonic frequency of the frequency of the second clock signal based on a frequency of the first divided clock signal and a frequency of the second divided clock signal.

A system, in accordance with one embodiment, includes a reference clock signal generator, a phase-lock loop, and a harmonic frequency detector coupled to the reference clock signal generator and the phase-lock loop. The reference clock signal generator is configured to generate a first clock signal. The phase-lock loop is configured to receive a data signal and generate a second clock signal based on the data signal. The harmonic frequency detector includes a first counter, a second counter, and a frequency comparator coupled to the first counter and the second counter. The first counter is configured to receive the first clock signal and generate a first divided clock signal by dividing the frequency of the first clock signal by a first divisor. The second counter is configured to receive the second clock signal and generate a second divided clock signal by dividing the frequency of the second clock signal by a second divisor. The frequency comparator is configured to generate an output indicating whether the frequency of the first clock signal is a harmonic frequency of the frequency of the second clock signal based on a frequency of the first divided clock signal and a frequency of the second divided clock signal.

A method, in accordance with one embodiment, includes receiving a first clock signal and receiving a second clock signal. The method further includes generating a first divided clock signal based on the first clock signal by dividing a frequency of the first clock signal by a first divisor. Additionally, the method includes generating a second divided clock signal based on the second clock signal by dividing the frequency of the second clock signal by a second divisor. Further, the method includes generating an output indicating whether the frequency of the first clock signal is a harmonic frequency of the frequency of the second clock signal based on a frequency of the first divided clock signal and a frequency of the second divided clock signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In various embodiments, a clock circuit generates an output clock signal based on a data signal. A harmonic frequency detector in the clock circuit determines whether the frequency of the output clock signal is above a threshold frequency that is between a reference frequency and twice the reference frequency. If the frequency of the output clock signal is above the threshold frequency, the harmonic frequency detector determines that the frequency of the output clock signal is a harmonic frequency of the reference frequency. In this way, the harmonic frequency detector detects whether the frequency of the output clock signal is a harmonic frequency of the reference frequency. In further embodiments, the harmonic frequency detector is programmable to select the threshold frequency, which defines a frequency tolerance for detecting whether the frequency of the output clock signal is a harmonic frequency of the reference frequency.

Figure 1:
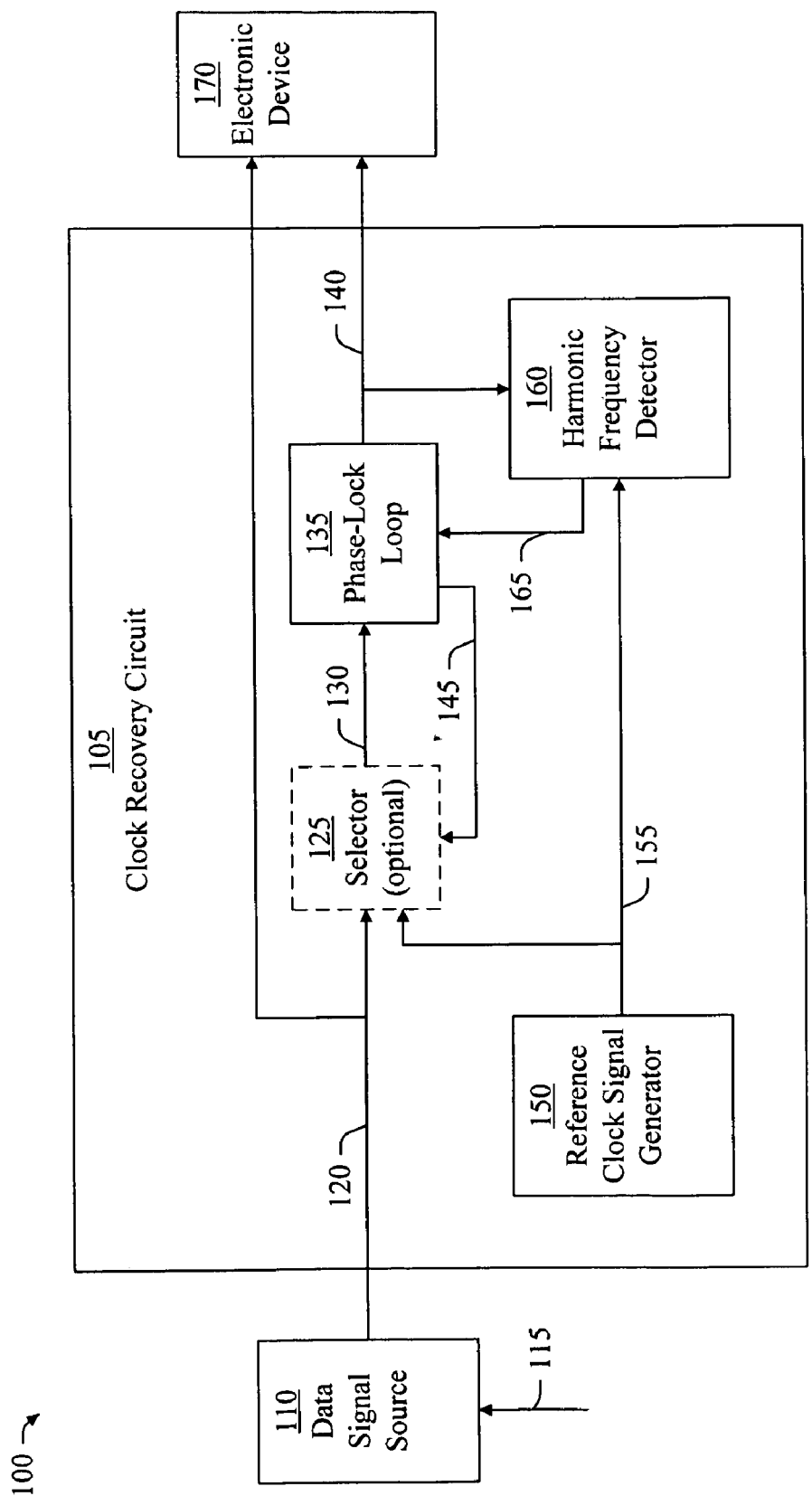
FIG. 1 is a block diagram of an electronic system, in accordance with an embodiment of the present invention.

FIG. 1 illustrates an electronic system 100, in accordance with an embodiment of the present invention. The electronic system 100 includes a clock recovery circuit 105, a data signal source 110, and an electronic device 170. The clock recovery circuit 105 is coupled (e.g., connected) to the data signal source 110 and the electronic device 170. Additionally, the data signal source 110 is coupled to the electronic device 170. The electronic device 170 includes electronic circuitry for processing the data signal 120 based on an output clock signal 140. For example, the electronic device 170 may be a communication device.

The data signal source 110 generates a data signal 120 based on a transmit clock signal 115 and provides (e.g., transmits) the data signal 120 to the clock recovery circuit 105. Moreover, the transmit clock signal 115 is embedded in the data signal 120. The clock recovery circuit 105 receives the data signal 120 from the data signal source 110 and generates the output clock signal 140 based on the data signal 120. In this way, the clock recovery circuit 105 reconstructs the transmit clock signal 115 of the data signal source 110. In various embodiments, the data signal 120 is a serial data signal in which a sequence of data values is represented by a series of binary values. In other embodiments, the data signal 120 includes a series of data pulses that represent a sequence of data values, as is discussed more fully herein.

In various embodiments, the clock recovery circuit 105 includes an optional selector 125, a phase-lock loop 135, a reference clock signal generator 150, and a harmonic frequency detector 160. The selector 125 is coupled (e.g., connected) to the reference clock signal generator 150 and the phase-lock loop 135. The harmonic frequency detector 160 is coupled (e.g., connected) to the phase-lock loop 135 and the reference clock signal generator 150. In embodiments including the selector 125, the phase-lock loop 135 is coupled to the reference clock signal generator 150 through the selector 125.

The reference clock signal generator 150 generates a reference clock signal 155 having a frequency (e.g., a reference frequency) that is substantially the same as a frequency (e.g., a transmit frequency) of the transmit clock signal 115. For example, the frequency of the transmit clock signal 115 may be a specified frequency and the reference clock signal generator 150 may be implemented to generate the reference clock signal 155 having the specified frequency within a specified tolerance (e.g., one percent). The phase-lock loop 135 generates the output clock signal 140 based on the data signal 120 in an alignment operation by aligning the phase of the output clock signal 140 with data transitions in the data signal 120. For example, the phase-lock loop 135 may align the phase of the output clock signal 140 with rising edges of data pulses (e.g., data transitions) occurring in the data signal 120. In this way, the phase-lock loop 135 reconstructs the transmit clock signal 115 of the data signal source 110 based on the data signal 120.

Ideally, the frequency of the output clock signal 140 is substantially the same as the frequency of the reference clock signal 155 when the phase-lock loop 135 has aligned the phase of the output clock signal 140 with data transitions in the data signal 120. In this way, the frequency of the output clock signal 140 is substantially the same as the frequency of the transmit clock signal 115 when the phase of the output clock signal 140 is aligned with data transitions in the data signal 120. In some cases, the phase-lock loop 135 may generate the output clock signal 140 such that the frequency of the output clock signal 140 is a harmonic frequency of the frequency of the transmit clock signal 115. For example, the phase-lock loop 135 may generate the output clock signal 140 to have a harmonic frequency of the frequency of the transmit clock signal 115 because of noise or invalid data in the data signal 120. In these cases, the frequency of the output clock signal 140 is deemed to be a harmonic frequency of the frequency of the reference clock signal 155 because the frequency of the output clock signal 140 is a positive integer multiple of the frequency of the reference clock signal 155 to within a given tolerance (e.g., one percent).

The harmonic frequency detector 160 determines whether the frequency of the output clock signal 140 is a harmonic frequency of the frequency of the transmit clock signal 115 based on the output clock signal 140 and the reference clock signal 155. In this way, the harmonic frequency detector 160 detects whether the frequency of the output clock signal 140 is a harmonic frequency of the frequency of the transmit clock signal 115. Further, the harmonic frequency detector 160 generates an output signal 165 indicating whether the frequency of the output clock signal 140 is a harmonic frequency of the frequency of the transmit clock signal 115 and provides the output signal 165 to the phase-lock loop 135. If the output signal 165 indicates that the frequency of the output clock signal 140 is a harmonic frequency of the frequency of the transmit clock signal 115, the phase-lock loop 135 performs a reset operation and then performs the alignment operation on the data signal 120 once again to generate the output clock signal 140. Further, the phase-lock loop 135 repeats the reset operation and the alignment operation until the output signal 165 no longer indicates that the frequency of the output clock signal 140 is a harmonic frequency of the frequency of the transmit clock signal 115.

In embodiments including the selector 125, the selector 125 passes the data signal 120 or the reference clock signal 155 to the phase-lock loop 135 as an input clock signal 130 based on a select signal 145. In various embodiments, the phase-lock loop 135 generates the select signal 145 to select the data signal 120 or the reference clock signal 155 and the selector 125 passes the selected signal (e.g., the data signal 120 or the reference clock signal 155) to the phase-lock loop 135 as the input clock signal 130. For example, the phase-lock loop 135 may perform a reset operation during reset or power-on of the clock recovery circuit 105 and generate the select signal 145 to select the reference clock signal 155 as the input clock signal 130 in the reset operation. Further, the phase-lock loop 135 may generate the select signal 145 to select the data signal 120 as the input clock signal 130 after the phase-lock loop 135 performs an alignment operation on the reference clock signal 155. The phase-lock loop 135 then performs an alignment operation on the data signal 120. In this way, the phase-lock loop 135 is more likely to align the phase of the output clock signal 140 with data transitions in the data signal 120 so that the frequency of the output clock signal 140 remains substantially the same as the frequency of the reference clock signal 155.

In some embodiments, the phase-lock loop 135 generates the select signal 145 to select the data signal 120 a predetermined period after the phase-lock loop 135 performs a reset operation. In other embodiments, the phase-lock loop 135 generates the select signal 145 to select the data signal 120 a predetermined period after the phase-lock loop 135 initiates an alignment procedure. In some embodiments, the select signal 145 indicates that the phase-lock loop 135 has aligned (e.g., locked) the phase of the output clock signal 140 to the phase of the reference clock signal 155. In other embodiments, the select signal 145 is generated by another component of the clock recovery circuit 105 other than the phase-lock loop 135. For example, the clock recovery circuit 105 may generate the select signal 145 to select the reference clock signal 155 during reset or power-on of the clock recovery circuit 105 and select the data signal 120 a predetermined period after reset or power-on of the clock recovery circuit 105.

In various embodiments, the clock recovery circuit 105 is implemented in a single semiconductor die. In other embodiments, the clock recovery circuit 105 is implemented in more than one semiconductor die. For example, the clock recovery circuit 105 may be implemented in multiple semiconductor die packaged in a multichip package. In some embodiments, the clock recovery circuit 105 and the electronic device 170 are implemented in the same semiconductor die. In other embodiments, the clock recovery circuit 105 and the electronic device 170 are implemented in multiple semiconductor die packaged in a multichip package.

Figure 2:
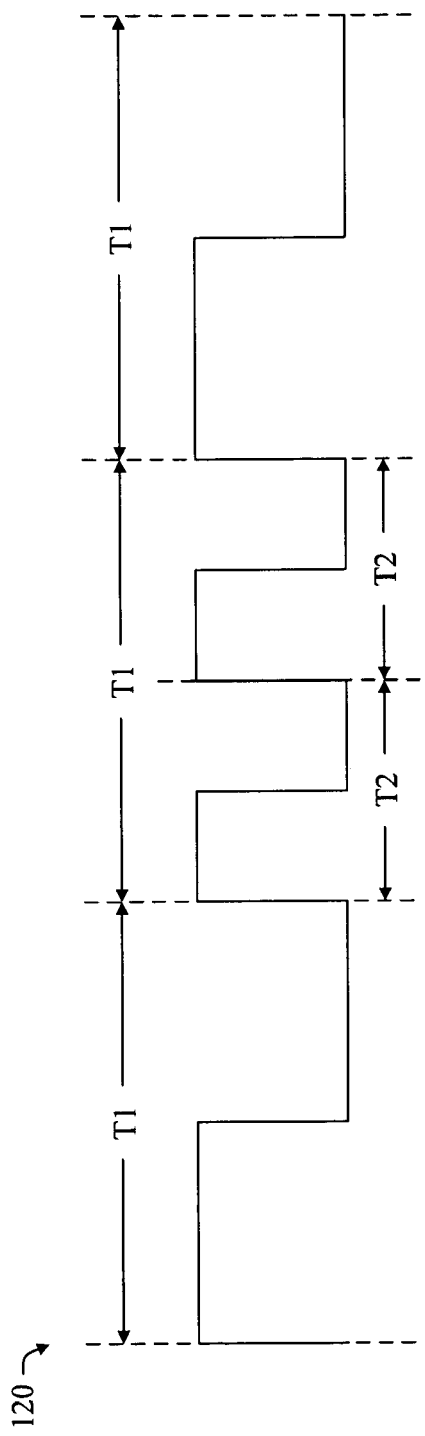
FIG. 2 is a timing diagram of a data signal, in accordance with an embodiment of the present invention.

FIG. 2 illustrates the data signal 120, in accordance with an embodiment of the present invention. The data signal 120 is an exemplary data signal in which data values are encoded into data pulses by using a pulse encoding technique. In various embodiments, the data signal 120 encodes a data value having a value of zero as a number of data pulses in a period T1 of the data signal 120 and encodes a data value having a value of one as a number of data pulses in a period T1 of the data signal 120. In other embodiments, the data signal 120 may be encoded by using another pulse encoding technique or a serial data encoding technique.

In the embodiment of FIG. 2, a data value of zero is represented by a square wave in a period T1 of the data signal 120 in which a data pulse has a logic value of one in a first half of the period T1 and a logic value of zero in a second half of the period T1. A data value of one is represented by a square wave in a first half of a period T1 and another square wave in a second half of the period T1. Moreover, the first half of the period T1 has a first period T2 and the second half of the period T1 has a second period T2. The square wave in the first half of the period T1 includes a data pulse having a logic value of one in a first half of the first period T2 and a logic value of zero in a second half of the first period T2. The square wave in the second half of the period T1 includes a data pulse having a logic value of one in a first half of the second period T2 and a logic value of zero in a second half of the second period T2.

The frequency of the data signal 120 is deemed to be the reciprocal of the minimal width of a valid data pulse in the data signal 120. In the embodiment of FIG. 2, the minimum width of a valid data pulse is the period T2. Thus, the frequency of the data signal 120 of FIG. 2 is deemed to be the reciprocal of the period T2.

Figure 3:
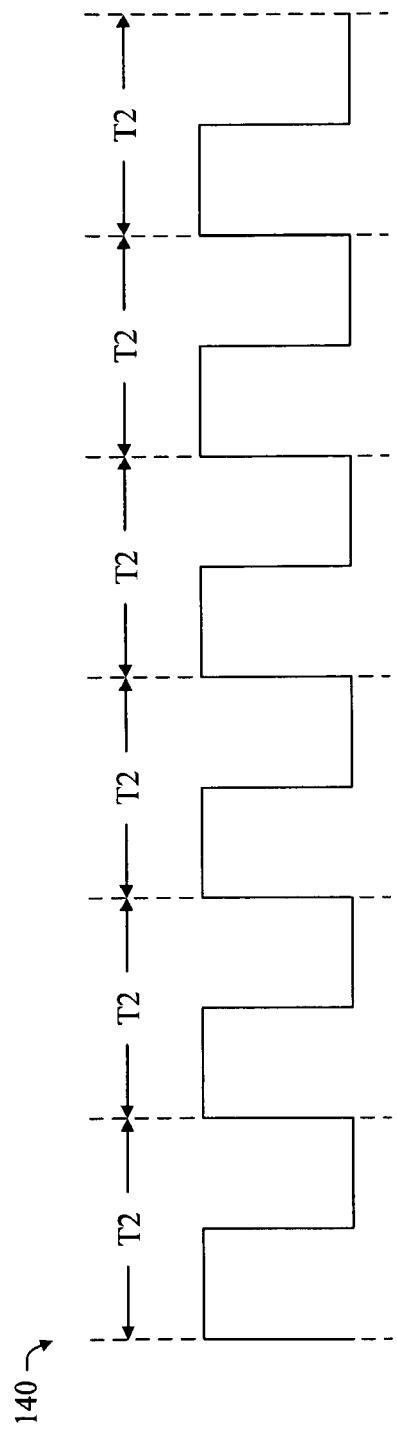
FIG. 3 is a timing diagram of an output clock signal, in accordance with an embodiment of the present invention.

FIG. 3 illustrates the output clock signal 140, in accordance with an embodiment of the present invention. The output clock signal 140 illustrated in FIG. 3 is an exemplary output clock signal 140 generated by the phase-lock loop 135 based on the data signal 120 of FIG. 2. As illustrated in FIG. 3, the output clock signal 140 includes a square wave in each period T2 of the output clock signal 140. Further, each period T2 of the data signal 120 includes a data pulse having a logic value of one in a first half of the period T2 and a logic value of zero in a second half of the period T2. Because the frequency of the output clock signal 140 is the reciprocal of the period T2, the frequency of the output clock signal 140 is the same as the frequency of the data signal 120 of FIG. 2.

Figure 4:
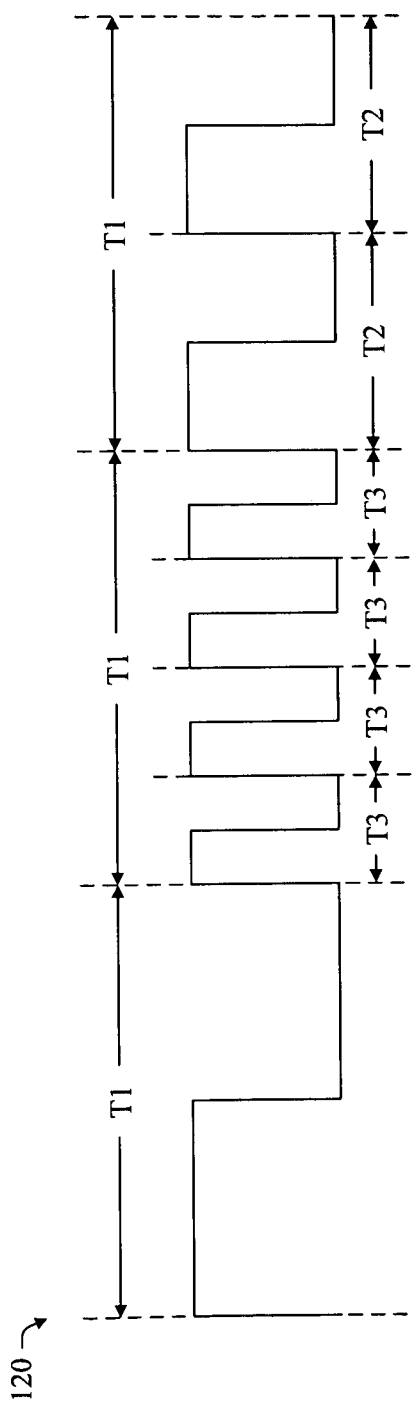
FIG. 4 is a timing diagram of a data signal, in accordance with an embodiment of the present invention.

FIG. 4 illustrates the data signal 120, in accordance with an embodiment of the present invention. The data signal 120 is an exemplary data signal similar to the data signal 120 of FIG. 2. In contrast to the data signal 120 of FIG. 2, the data signal 120 of FIG. 4 is corrupt because the data signal 120 of FIG. 4 includes four data pulses in a period T1 of the data signal 120, each of which occurs in a period T3. Moreover, each of the periods T3 is one-quarter of the period T1. Because the pulse encoding technique does not define a data value represented by four data pulses in a period T1 of the data signal 120, the four data pulses represent invalid data.

In various embodiments, the data signal 120 may be corrupt during reset or power-on of the data signal source 110. For example, the data signal 120 may be corrupt during power-on of the data signal source 110 because of noise occurring in the data signal source 110 at power-on that affects the data signal 120. As another example, data values may not be correctly encoded into the data signal 120 during power-on of the data signal source 110.

The frequency of the data signal 120 is deemed to be the reciprocal of the minimal width of a valid data pulse in the data signal 120. In the embodiment of FIG. 4, the minimum width of a valid data pulse is the period T2. Thus, the frequency of the data signal 120 of FIG. 4 is deemed to be the reciprocal of the period T2.

Figure 5:
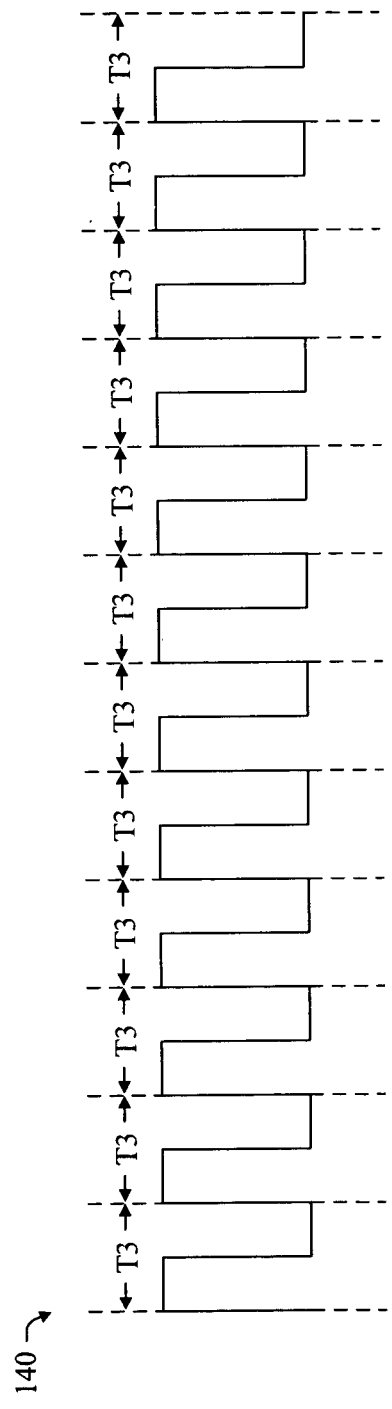
FIG. 5 is a timing diagram of an output clock signal, in accordance with an embodiment of the present invention.

FIG. 5 illustrates the output clock signal 140, in accordance with an embodiment of the present invention. The output clock signal 140 illustrated in FIG. 5 is an exemplary output clock signal 140 generated by the phase-lock loop 135 based on the data signal 120 of FIG. 4. As illustrated in FIG. 4, the output clock signal 140 includes a square wave in each period T3 of the output clock signal 140. Further, each period T3 of the data signal 120 includes a data pulse having a logic value of one in a first half of the period T3 and a logic value of zero in a second half of the period T3.

Because the frequency of the output clock signal 140 is the reciprocal of the period T3 and the period T2 is one-half of the period T3, the frequency of the output clock signal 140 is twice the frequency of the data signal 120 of FIG. 4. In this way, the frequency of the output clock signal 140 is a harmonic frequency (e.g., a first harmonic frequency) of the frequency of the transmit clock signal 115 embedded in the data signal 120.

Figure 6:
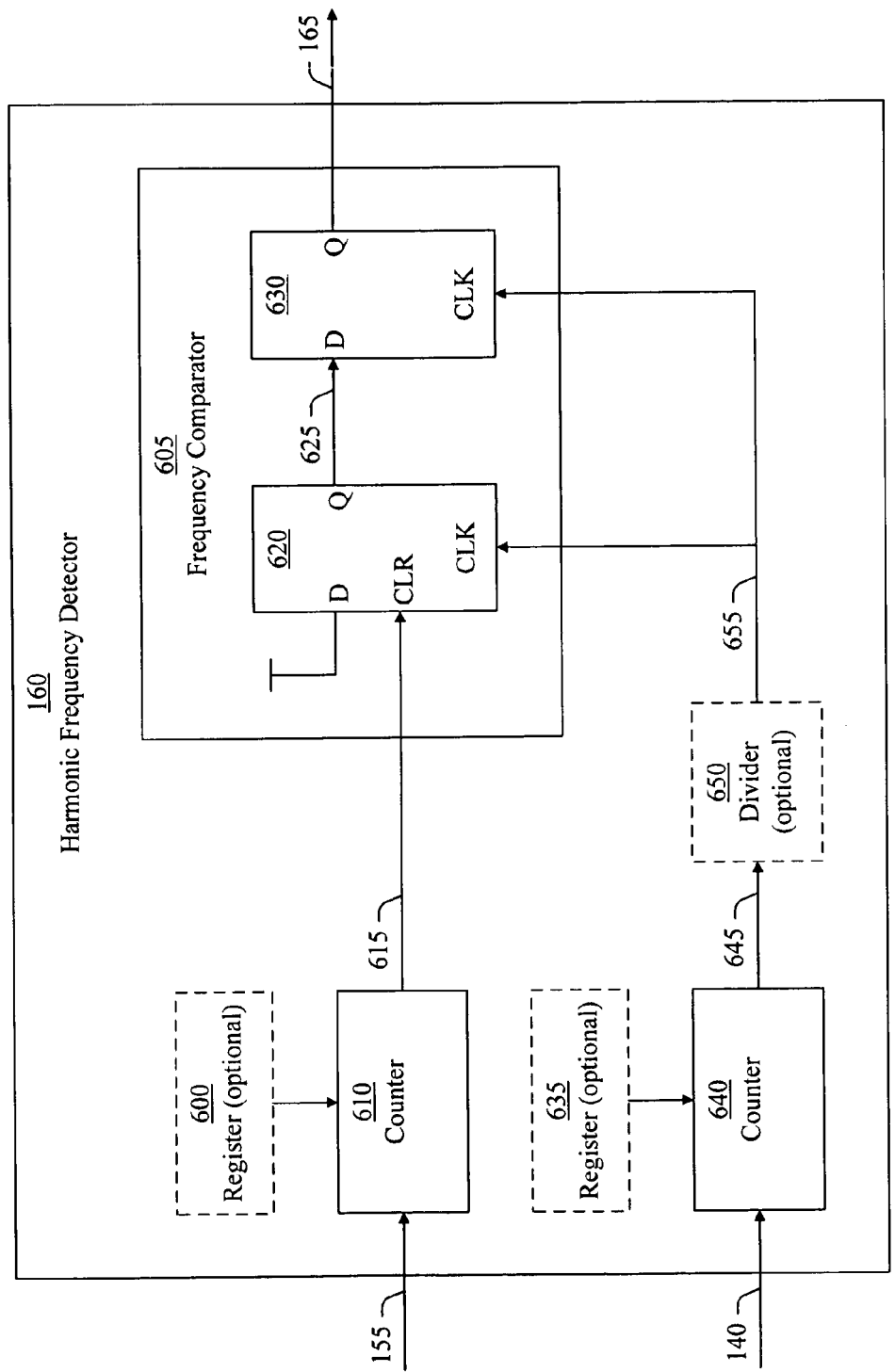
FIG. 6 is a block diagram of a harmonic frequency detector, in accordance with an embodiment of the present invention.

FIG. 6 illustrates the harmonic frequency detector 160, in accordance with an embodiment of the present invention. The harmonic frequency detector 160 includes a frequency comparator 605, a counter 610, and a counter 640. The frequency comparator 605 is coupled (e.g., connected) to the counter 610 and the counter 640. In some embodiments, the harmonic frequency detector 160 includes an optional register 600 coupled (e.g., connected) to the counter 610 and an optional register 635 coupled (e.g., connected) to the counter 640. In some embodiments, the harmonic frequency detector 160 includes an optional divider 650 coupled (e.g., connected) to the counter 640 and the frequency comparator 605. In embodiments including the divider 650, the counter 640 is coupled to the frequency comparator 605 through the divider 650.

In various embodiments, the counter 610 generates a divided clock signal 615 by dividing the frequency of the reference clock signal 155 by a first divisor. Additionally, the counter 640 generates a divided clock signal 655 by dividing the frequency of the output clock signal 140 by a second divisor. In embodiments including the divider 650, counter 640 generates a divided clock signal 645 by dividing the frequency of the output clock signal 140 by the second divisor and the divider 650 generates the divided clock signal 655 by dividing the frequency of the divided clock signal 645 by two. In this way, the divider 650 further divides the frequency of the output clock signal 140. For example, the divider 650 may be a data flip-flop that generates the divided clock signal 655 by dividing the divided clock signal 645 by two. In embodiments without the divider 650, the divided clock signal 655 is the same as the divided clock signal 645.

In embodiments including the register 600 and the register 635, the register 600 stores the divisor of the counter 610 (e.g., the first divisor) and the register 635 stores the divisor of the counter 640 (e.g., the second divisor). In some embodiments, the first divisor stored in the register 600 is a fixed value (e.g., a predetermined value) and the second divisor stored in the register 635 is a fixed value (e.g., a predetermined value). In other embodiments, the register 600 may be programmed to store the first divisor and the register 635 may be programmed to store the second divisor. In this way, the first divisor and the second divisor are programmable. In some embodiments, the counter 610 includes the register 600 and the counter 640 includes the register 635. In embodiments without the register 600 and the register 635, the counter 610 is implemented to divide the frequency of the reference clock signal 155 by a fixed (e.g., predetermined) first divisor and the counter 640 is implemented to divide the frequency of the output clock signal 140 by a fixed (e.g., predetermined) second divisor.

The frequency comparator 605 determines whether the frequency of the divided clock signal 615 is higher than twice the frequency of the divided clock signal 655. Further, the frequency comparator 605 generates the output signal 165 indicating whether the frequency of the divided clock signal 615 is higher than twice the frequency of the divided clock signal 655. For example, the output signal 165 may be a data value, such as a logic value, or a signal indicating the data value. In various embodiments, the frequency comparator 605 stores data values and outputs the data values as the output signal 165. In this way, the output signal 165 is a sequence of data values output from the frequency comparator 605.

The first divisor of the counter 610 and the second divisor of the counter 640 are selected so that the output signal 165 indicates whether the frequency of the output clock signal 140 is a harmonic frequency of the frequency of the transmit clock signal 115, as is described more fully herein. In this way, the harmonic frequency detector 160 detects whether the frequency of the output clock signal 140 is a harmonic frequency of the frequency of the transmit clock signal 115.

In various embodiments, the frequency of the reference clock signal 155 may be represented by a value F1 and the frequency of the output clock signal 140 may be represented by a value F2. Further, the first divisor may be represented by a value A and the second divisor may be represented by a value B. In embodiments without the divider 650, the frequency of the divided clock signal 615 may be represented by the quotient determined by dividing the value F1 by the value A (e.g., F1/A) and the frequency of the divided clock signal 655 may be represented by the quotient determined by dividing the value F2 by the value B (e.g., F2/B). Further, the first divisor and the second divisor together define a multiple M of the harmonic frequency detector 160 which is determined by dividing twice the value B by the value A (e.g., 2*B/A).

The multiple M and the frequency of the reference clock signal 155 together define a threshold frequency which is determined by multiplying the multiple M by the value F1 (e.g., M*F1). Moreover, the threshold frequency is the frequency of the output clock signal 140 above which the harmonic frequency detector 160 determines the frequency of the output clock signal 140 is a harmonic frequency of the frequency of the transmit clock signal 115. For example, if the value A is equal to one and the value B is equal to one, the threshold frequency of the harmonic frequency detector 160 is twice the frequency of the reference clock signal 155.

In various embodiments without the divider 650, the value B is greater than one-half the value A and less than the value A (e.g., A/2<B<A). Thus, the value of the multiple M is between the value one and the value two (e.g., 1<M<2). In one embodiment, the value A is equal to four, the value B is equal to three, and the multiple M is equal to one-and-a-half. In this embodiment, the threshold frequency of the harmonic frequency detector 160 is one-and-a-half times the frequency of the reference clock signal 155. Moreover, output signal 165 generated by the harmonic frequency detector 160 indicates that the output clock signal 140 is a harmonic frequency of the frequency of the transmit clock signal 115 if the frequency of the output clock signal 140 is higher than one-and-a-half times the frequency of the reference clock signal 155.

In various embodiments including the divider 650, the first divisor and the second divisor together define the multiple M of the harmonic frequency detector 160, which is determined by dividing four times the value B by the value A (e.g., 4*B/A). Further, the value B is greater than one-quarter the value A and less than one-half the value A (e.g., A/4<B<A/2). Thus, the value of the multiple M is between the value one and the value two (e.g., 1<M<2) in embodiments including the divider 650 and in embodiments without the divider 650.

The threshold frequency of the harmonic frequency detector 160 defines a frequency tolerance of the harmonic frequency detector 160 for determining whether the frequency of the output clock signal 140 is a harmonic frequency of the frequency of the transmit clock signal 115. The frequency tolerance of the harmonic frequency detector 160 may be expressed as a percentage of the first harmonic frequency of the frequency of the transmit clock signal 115 by subtracting the threshold frequency from the first harmonic frequency of the frequency of the transmit clock signal 115 and dividing the result by the first harmonic frequency. Moreover, the frequency tolerance of the harmonic frequency detector 160 may be selected for a specific application of the harmonic frequency detector 160.

In one embodiment, the frequency comparator 605 includes a flip-flop 620 and a flip-flop 630 coupled (e.g., connected) to the flip-flop 620. For example, each of the flip-flops 620 and 630 may be a data flip-flop (e.g., a D flip-flop) or another flip-flop configured to operate as a data flip-flop. The flip-flop 620 has a data input D, a clear input CLR, and a clock input CLK. The data input D of the flip-flop 620 is coupled (e.g., connected) to a high voltage potential representing a logic value of one. In this way, the flip-flop 620 receives a logic value of one at the data input D of the flip-flop 620. Additionally, the flip-flop 620 receives the divided clock signal 615 at the clear input CLR of the flip-flop 620 and the divided clock signal 655 at the clock input CLK of the flip-flop 620. The flip-flop 620 generates an output signal 625 at an output Q of the flip-flip 620 based on the logic value at the data input D of the flip-flop 620, the divided clock signal 615 at the clear input CLR of the flip-flop 620, and the divided clock signal 655 at the clock input CLK of the flip-flop 620. If the divided clock signal 615 has a logic value of one, the flip-flop 620 generates the output signal 625 to have a logic value of zero. Otherwise, if the divided clock signal 615 has a logic value of zero, the flip-flop 620 generates the output signal 625 to have a logic value of one at a rising edge of the divided clock signal 655 and to remain a logic value of one until the divided clock signal 615 transitions to a logic value of one.

The flip-flop 630 has a data input D and a clock input CLK. The data input D of the flip-flop 630 receives the output signal 625 from the flip-flop 620 and generates the output signal 165 to have the logic value of the output signal 625 at a rising edge of the divided clock signal 655. Moreover, if the frequency of the divided clock signal 655 is lower than twice the frequency of the divided clock signal 615, the flip-flop 630 generates the output signal 165 to have a logic value of zero. Otherwise, if the frequency of the divided clock signal 655 is higher than twice the frequency of the divided clock signal 615, the flip-flop 630 generates the output signal 165 to have a logic value of one. In this way, the frequency comparator 605 detects whether the frequency of the divided clock signal 655 is higher than twice the frequency of the divided clock signal 615.

Figure 7:
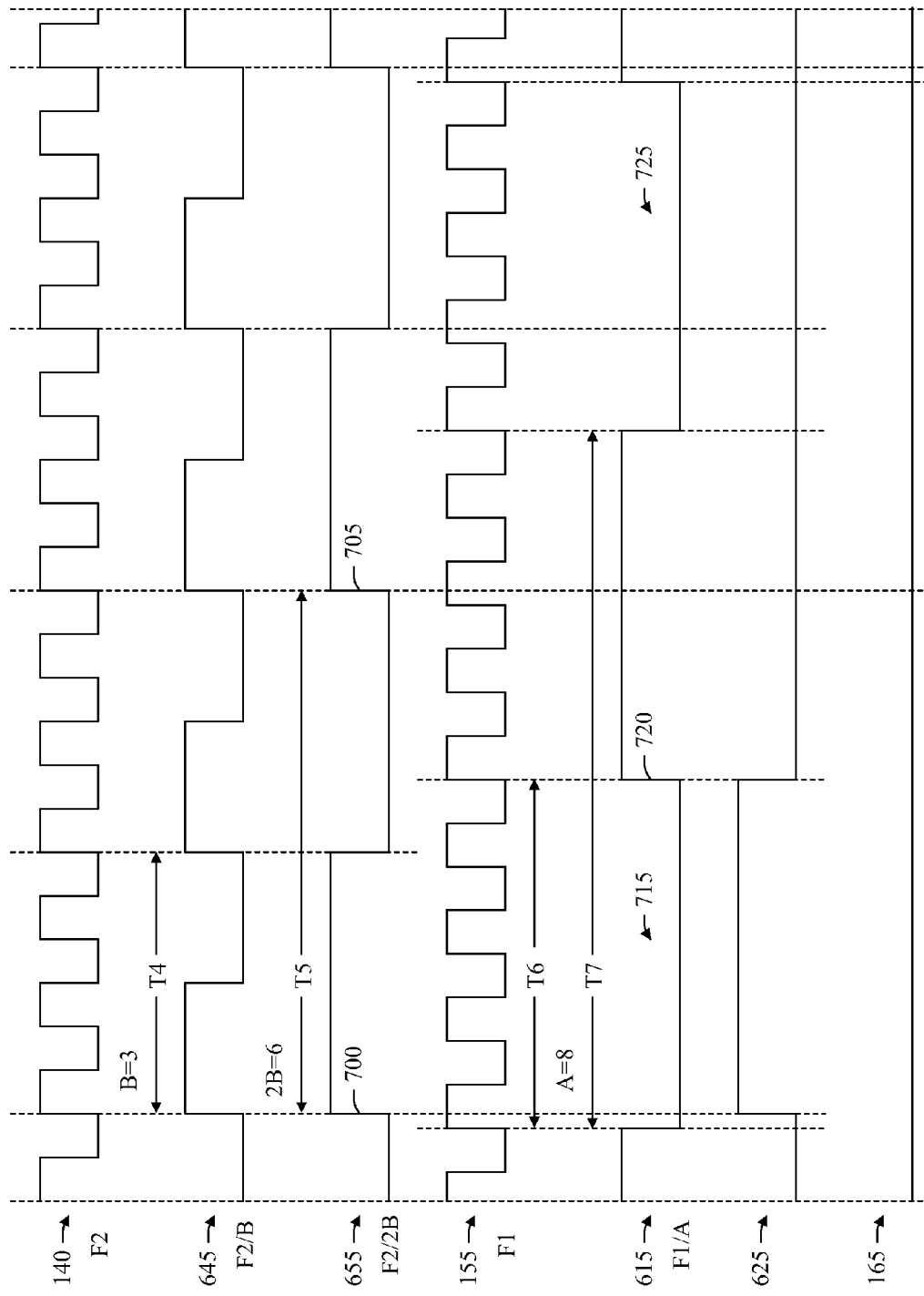
FIG. 7 is a timing diagram of signals in a clock circuit, in accordance with an embodiment of the present invention.

FIG. 7 illustrates signals in the clock recovery circuit 105, in accordance with an embodiment of the present invention. The signals illustrated in FIG. 7 are exemplary signals and include the output clock signal 140, the divided clock signal 645, and the divided clock signal 655. Additionally, the signals include the reference clock signal 155, the divided clock signal 615, the output signal 625, and the output signal 165. In this embodiment, the harmonic frequency detector 160 includes the divider 650, the divisor of the counter 610 has a value of eight (e.g., A=8), and the divisor of the counter 640 has a value of three (e.g., B=3). Thus, the multiplier of the harmonic frequency detector 160 has a value of one-and-a-half (e.g., M=4*B/A=4*3/8=3/2). Moreover, the frequency of the output clock signal 140 is substantially the same as the frequency of the transmit clock signal 115.

As illustrated in FIG. 7, the divided clock signal 645 has a period T4 equal to three cycles of the output clock signal 140 and the divided clock signal 655 has a period T5 equal to six cycles of the output clock signal 140. The divided clock signal 615 has a half-period T6 equal to four cycles of the reference clock signal 155 and a period T7 equal to eight cycles of the reference clock signal 155. The output signal 625 has a logic value of zero before a first rising edge 700 of the divided clock signal 655 because the divided clock signal 615 at the clear input CLR of the flip-flop 620 has asserted a logic value of one after the previous rising edge of the divided clock signal 655. Moreover, the output signal 165 has a logic value of zero before the first rising edge 700 of the divided clock signal 655. The output signal 165 remains at a logic value of zero after the first rising edge 700 of the divided clock signal 655 because the output signal 625 at the data input D of the flip-flop 630 has a logic value of zero at the first rising edge 700 of the divided clock signal 655.

The flip-flop 620 generates the output signal 625 to have a logic value of one at the first rising edge 700 of the divided clock signal 655 because the logic value of the divided clock signal 615 at the clear input CLR of the flip-flop 620 has a logic value of zero at the first rising edge 700 of the divided clock signal 655 and the data input D of the flip-flop 620 has a logic value of one. The output signal 625 remains at a logic value of one until the divided clock signal 615 transitions to a logic value of one at a first rising edge 720 of the divided clock signal 615 and the flip-flop 620 generates the output signal 625 to have a value of zero. The output signal 165 remains at a logic value of zero at a second rising edge 705 of the divided clock signal 655 because the output signal 625 has a logic value of zero at the second rising edge 705 of the divided clock signal 655.

Figure 8:
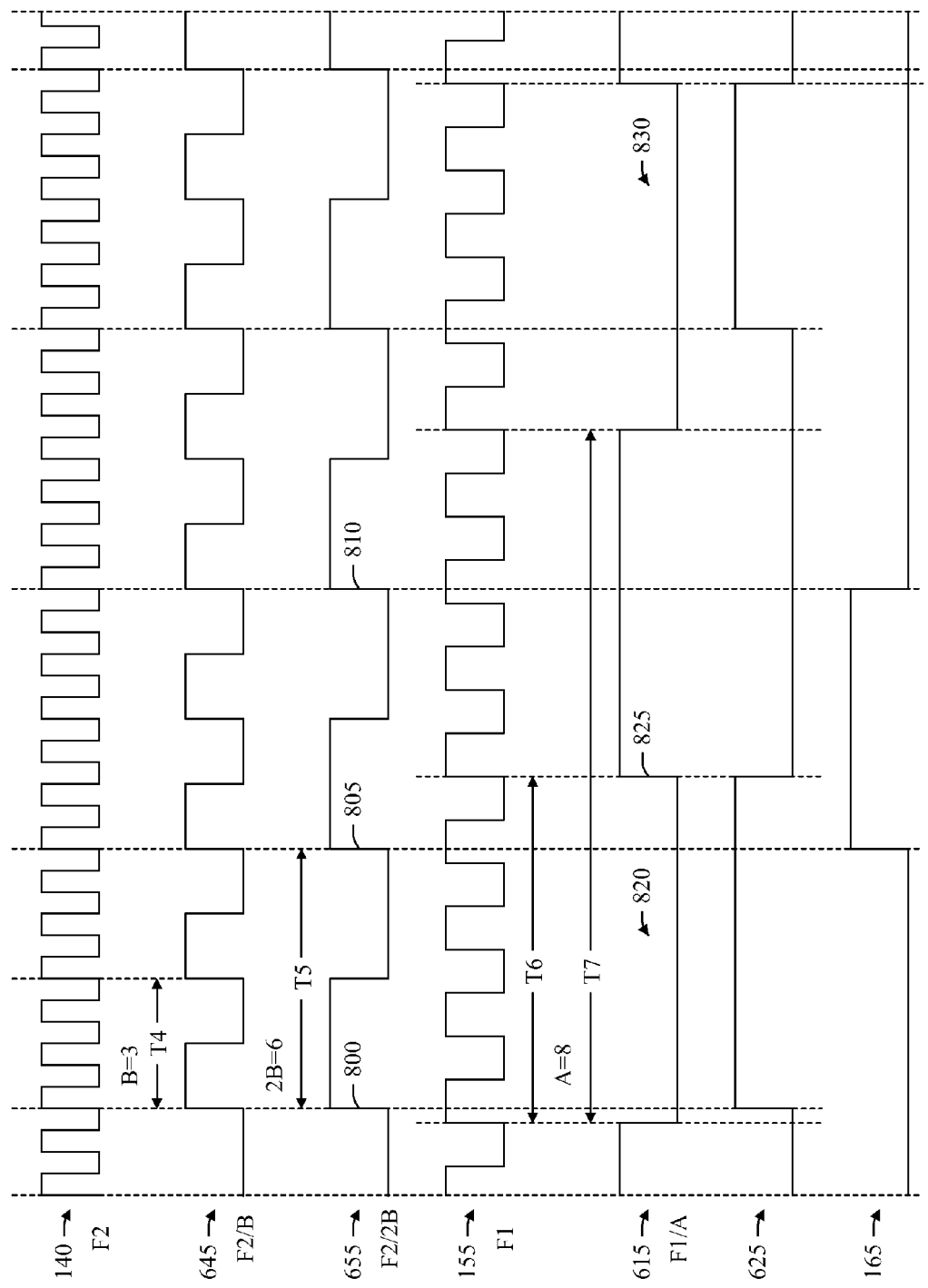
FIG. 8 is a timing diagram of signals in a clock circuit, in accordance with an embodiment of the present invention.

FIG. 8 illustrates signals in the clock recovery circuit 105, in accordance with an embodiment of the present invention. The signals illustrated in FIG. 8 are exemplary signals and include the signals illustrated in FIG. 7. In contrast to the output clock signal 140 of FIG. 7, the output clock signal 140 of FIG. 8 is twice the frequency of the transmit clock signal 115. Thus, the frequency of the output clock signal 140 of FIG. 8 is a harmonic frequency of the frequency of the transmit clock signal 115.

As illustrated in FIG. 8, the divided clock signal 645 has a period T4 equal to three cycles of the output clock signal 140 and the divided clock signal 655 has a period T5 equal to six cycles of the output clock signal 140. The divided clock signal 615 has a half-period T6 equal to four cycles of the reference clock signal 155 and a period T7 equal to eight cycles of the reference clock signal 155. The output signal 625 has a logic value of zero before a first rising edge 800 of the divided clock signal 655 because the divided clock signal 615 at the clear input CLR of the flip-flop 620 has asserted a logic value of one after the previous rising edge of the divided clock signal 655. Moreover, the output signal 165 has a logic value of zero before the first rising edge 800 of the divided clock signal 655. The output signal 165 remains at a logic value of zero after the first rising edge 800 of the divided clock signal 655 because the output signal 625 at the data input D of the flip-flop 630 has a logic value of zero at the first rising edge 800 of the divided clock signal 655.

The flip-flop 620 generates the output signal 625 to have a logic value of one at the first rising edge 800 of the divided clock signal 655 because the logic value of the divided clock signal 615 at the clear input CLR of the flip-flop 620 has a logic value of zero at the first rising edge 800 of the divided clock signal 655 and the data input D of the flip-flop 620 has a logic value of one. The output signal 625 remains at a logic value of one until the divided clock signal 615 transitions to a logic value of one at a first rising edge 825 of the divided clock signal 615 and the flip-flop 620 generates the output signal 625 to have a value of zero. The output signal 165 transitions from a logic value of zero to a logic value of one at a second rising edge 805 of the divided clock signal 655 because the logic value of the divided clock signal 615 at the clear input CLR of the flip-flop 620 has a logic value of zero and the output signal 625 has a logic value of one at the second rising edge 805 of the divided clock signal 655. In this way, the output signal 165 indicates that the frequency of the output clock signal 140 is a harmonic frequency of the frequency of the reference clock signal 155. The output signal 625 then transitions from a logic value of one to a logic value of zero at a first rising edge 825 of the divided clock signal 615. Moreover, the output signal 165 transitions from a logic value of one to a logic value of zero at a third rising edge 810 of the divided clock signal 655.

In the embodiment of FIG. 7, the output signal 165 remains at a logic value of zero at the second rising edge 705 of the divided clock signal 655 because the second rising edge 705 of the divided clock signal 655 occurs after the first rising edge 720 of the divided clock signal 615. In the embodiment of FIG. 8, the output signal 165 transitions from a logic value of zero to a logic value of one at the second rising edge 805 of the divided clock signal 655 because the second rising edge 805 of the divided clock signal 655 occurs before the first rising edge 825 of the divided clock signal 615. Generally, the frequency comparator 605 generates the output signal 165 to indicate the frequency of the divided clock signal 655 is at least twice the frequency of the frequency of the divided clock signal 615 when the period T5 of the divided clock signal 655 is less than the half-period T6 of the divided clock signal 615. Stated differently, the frequency comparator 605 generates the output signal 165 to indicate the frequency of the divided clock signal 655 is at least twice the frequency of the frequency of the divided clock signal 615 when the period T5 of the divided clock signal 655 is less than the half of the period T7 of the divided clock signal 615 (i.e., the period T5 is less than the half-period T6).

As illustrated in FIG. 8, the divided clock signal 655 will have at least two rising edges (e.g., rising edges 800 and 805) during at least one low phase 820 of the divided clock signal 615 (i.e., a half-period T6 in which the divided clock signal has a low value) when the frequency of the divided clock signal 655 is at least twice the frequency of the divided clock signal 615. As also illustrated in FIG. 8, the divided clock signal 655 may not have two rising edges during another low phase of the divided clock signal 615. For example, the divided clock signal 655 does not have two rising edges during the low phase 830 of the divided clock signal 615. As illustrated in FIG. 7, the divided clock signal 655 will not have more than one rising edge during each low phase of the divided clock signal 615 when the frequency of the divided clock signal 655 is not at least twice the frequency of the divided clock signal 615. For example, the divided clock signal 655 has one rising edge 700 during the low phase 715 of the divided clock signal 655 but does not have a rising edge during the low phase 725 of the divided clock signal 655.

Figure 9:
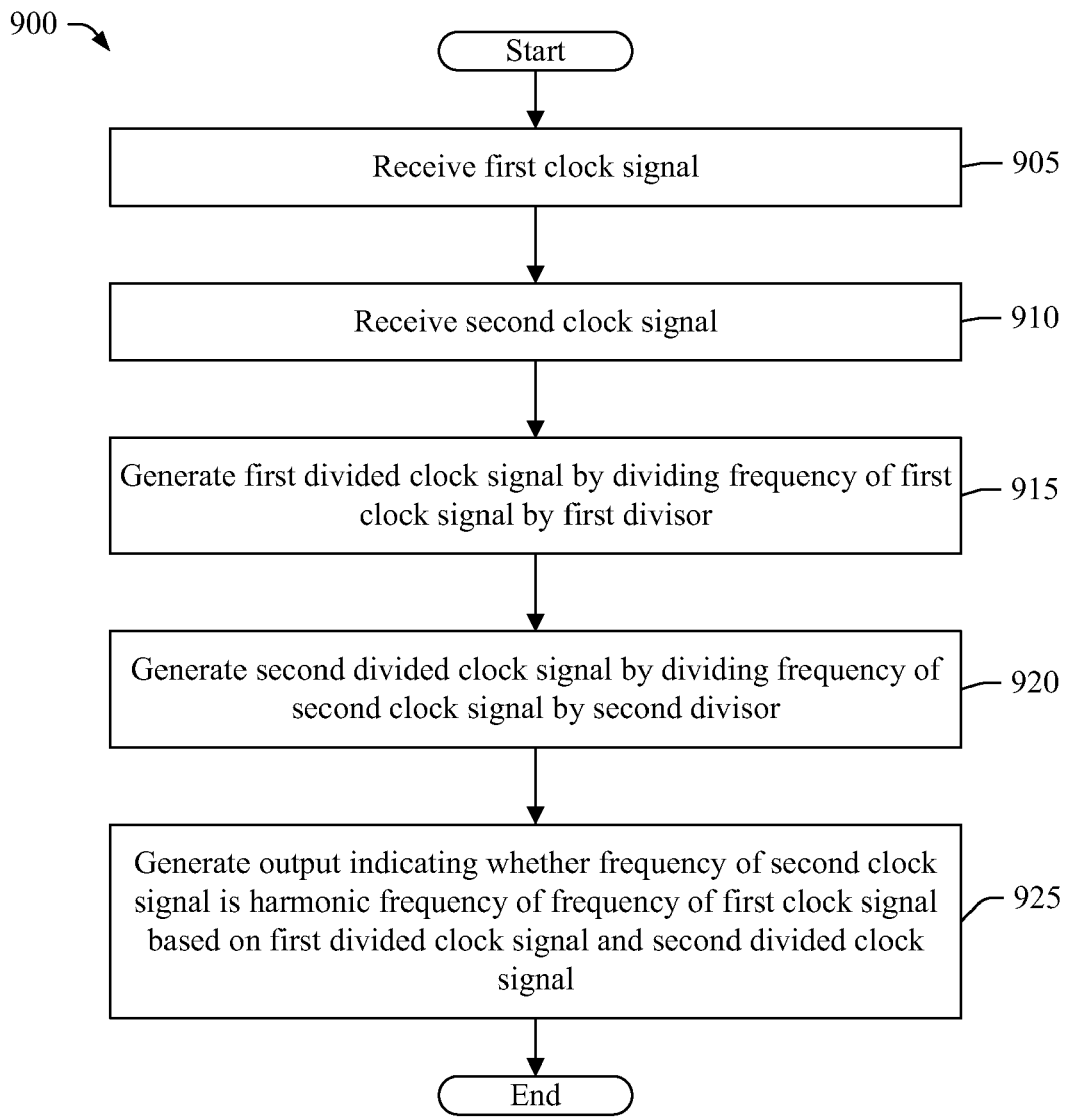
FIG. 9 is a flow chart of a method of detecting a harmonic frequency in a clock signal, in accordance with an embodiment of the present invention.

FIG. 9 is a flow chart of a method 900 of detecting a harmonic frequency in a clock signal, in accordance with an embodiment of the present invention. In step 905, a first clock signal is received. In various embodiments, the reference clock signal generator 150 generates the reference clock signal 155 (e.g., the first clock signal) and the harmonic frequency detector 160 receives the reference clock signal 155 from the reference clock signal generator 150. The method 900 then proceeds to step 910.

In step 910, a second clock signal is received. In various embodiments, the phase-lock loop 135 generates the output clock signal 140 (e.g., the second clock signal) based on the data signal 120 and the harmonic frequency detector 160 receives the output clock signal 140 from the phase-lock loop 135. The method 900 then proceeds to step 915.

In step 915, a first divided clock signal is generated by dividing the frequency of the first clock signal by a first divisor. In various embodiments, the counter 610 generates the divided clock signal 615 (e.g., the first divided clock signal) by dividing the frequency of the reference clock signal 155 by the first divisor. In some embodiments, the first divisor is a predetermined value stored in the register 600 or the counter 610. In other embodiments, the first divisor is a programmable value stored in the register 600 or the counter 610. The method 900 then proceeds to step 920.

In step 920, a second divided clock signal is generated by dividing the frequency of the second clock signal by a second divisor. In various embodiments, the counter 640 generates the divided clock signal 655 (e.g., the second divided clock signal) by dividing the frequency of the output clock signal 140 by the second divisor. In other embodiments, the counter 640 generates the divided clock signal 645 by dividing the frequency of the output clock signal 140 by the second divisor and the divider 650 generates the divided clock signal 655 (e.g., the second divided clock signal) by further dividing the frequency of the output clock signal 140 by a divisor of two. In some embodiments, the second divisor is a predetermined value stored in the register 635 or the counter 640. In other embodiments, the second divisor is a programmable value stored in the register 635 or the counter 640. The method 900 then proceeds to step 925.

In step 925, an output is generated indicating whether the frequency of the second clock signal is a harmonic frequency of the frequency of the first clock signal based on the first divided clock signal and the second divided clock signal. In various embodiments, the frequency comparator 605 generates the output signal 165 indicating the frequency of the output clock signal 140 (e.g., the second clock signal) is a harmonic frequency of the frequency of the transmit clock signal 115 (e.g., the first clock signal) if the frequency of the divided clock signal 655 is higher than twice the frequency of the divided clock signal 615. Otherwise, the frequency comparator 605 generates the output signal 165 indicating the frequency of the output clock signal 140 is not a harmonic frequency of the frequency of the transmit clock signal 115 if the frequency of the divided clock signal 655 is not higher than twice the frequency of the divided clock signal 615. In this way, the harmonic frequency detector 160 generates the output signal 165 indicating whether the frequency of the output clock signal 140 is a harmonic frequency of the frequency of the transmit clock signal 115. Moreover, the output signal 165 also indicates whether the frequency of the output clock signal 140 is a harmonic frequency of the reference clock signal 155 (e.g., to within a specified tolerance). The method 900 then ends.

In various embodiments, the method 900 may include more or fewer steps than the steps 905-925 described above and illustrated in FIG. 9. In some embodiments, one or more of the steps 905-925 of the method 900 may be performed in parallel or substantially simultaneously. For example the step 905 and the step 910 may be performed in parallel. In various embodiments, the steps 905-925 of the method 900 may be performed in a different order than the order described above and illustrated in FIG. 9. For example, step 910 may be performed before step 905.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A system for determining whether a frequency of a second clock signal is a harmonic frequency of a frequency of a first clock signal, the system comprising:

a first counter configured to generate a first divided clock signal by dividing the frequency of the first clock signal by a first divisor;

a second counter configured to generate a second divided clock signal by dividing the frequency of the second clock signal by a second divisor; and a frequency comparator coupled to the first counter and the second counter, the frequency comparator configured to generate an output indicating whether a frequency of the second divided clock signal is at least twice a frequency of the first divided clock signal, the frequency comparator comprising:

a first flip-flop comprising a clock input configured to receive the second divided clock signal, the first flip-flop further configured to generate an output signal based on the first divided clock signal and the second divided clock signal; and a second flip-flop comprising a clock input configured to receive the second divided clock signal, the second flip-flop further configured to generate the output based on the output signal and the second divided clock signal.

2. The system of claim 1, wherein the first divisor and the second divisor together define a threshold frequency for determining whether the frequency of the second clock signal is a harmonic frequency of the frequency of the first clock signal, and the output indicates whether the frequency of the second clock signal is higher than the threshold frequency.

3. The system of claim 1, wherein the first flip-flop further includes a clear input configured to receive the first divided clock signal, and the second flip-flop further includes a data input configured to receive the output signal.

4. The system of claim 3, wherein the first flip-flop has a data input configured to receive a voltage potential representing a logic value of one.

5. The system of claim 1, wherein the first divided clock signal has a symmetrical waveform.

6. The system of claim 1, wherein the second divided clock signal has a symmetrical waveform.

7. The system of claim 1, wherein each of the first divided clock signal and the second divided clock signal has a symmetrical waveform.

8. A method for determining whether a frequency of a second clock signal is a harmonic frequency of a frequency of a first clock signal, the method comprising:

generating a first divided clock signal by dividing the frequency of the first clock signal by a first divisor;

generating a second divided clock signal by dividing the frequency of the second clock signal by a second divisor; and generating an output indicating whether a frequency of the second divided clock signal is at least twice a frequency of the first divided clock signal, wherein determining whether the frequency of the second divided clock signal is at least twice the frequency of the first divided clock signal comprises:

receiving the second divided clock signal at a clock input of a first flip-flop;

generating an output signal at the first flip-flop based on the first divided clock signal and the second divided clock signal;

receiving the second divided clock signal at a clock input of a second flip-flop; and generating the output at the second flip-flop based on the output signal and the second divided clock signal.

9. The method of claim 8, wherein the first divisor and the second divisor together define a threshold frequency for determining whether the frequency of the second clock signal is a harmonic frequency of the frequency of the first clock signal, and the output indicates whether the frequency of the second clock signal is higher than the threshold frequency.

10. The method of claim 8, further comprising:
receiving the first divided clock signal at a clear input of the first flip-flop; and
receiving the output signal at a data input of the second flip-flop.

11. The method of claim 10, further comprising receiving a voltage potential representing a logic value of one at a data input of the first flip-flop.

12. The method of claim 8, wherein the first divided clock signal has a symmetrical waveform.

13. The method of claim 8, wherein the second divided clock signal has a symmetrical waveform.

14. The method of claim 8, wherein each of the first divided clock signal and the second divided clock signal has a symmetrical waveform.

15. A system for determining whether a frequency of a second clock signal is a harmonic frequency of a frequency of a first clock signal, the system comprising:

a first counter configured to generate a first divided clock signal having a frequency being the same as the frequency of the first clock signal divided by a first divisor;

a second counter configured to generate a second divided clock signal having a frequency being the same as the frequency of the second clock signal divided by a second divisor; and a frequency comparator coupled to the first counter and the second counter, the frequency comparator configured to generate an output indicating whether a frequency of the second divided clock signal is at least twice a frequency of the first divided clock signal, the frequency comparator comprising:

a first flip-flop comprising a clock input configured to receive the second divided clock signal, the first flip-flop further configured to generate an output signal based on the first divided clock signal and the second divided clock signal; and a second flip-flop comprising a clock input configured to receive the second divided clock signal, the second flip-flop further configured to generate the output based on the output signal and the second divided clock signal.

16. The system of claim 15, wherein the first divisor and the second divisor together define a threshold frequency for determining whether the frequency of the second clock signal is a harmonic frequency of the frequency of the first clock signal, and the output indicates whether the frequency of the second clock signal is higher than the threshold frequency.

17. The system of claim 15, wherein the first flip-flop further includes a clear input configured to receive the first divided clock signal and a data input configured to receive a voltage potential representing a logic value of one, and the second flip-flop further includes a data input configured to receive the output signal.

18. The system of claim 15, wherein the first divided clock signal has a symmetrical waveform.

19. The system of claim 15, wherein the second divided clock signal has a symmetrical waveform.

20. The system of claim 15, wherein each of the first divided clock signal and the second divided clock signal has a symmetrical waveform.

* * * * *